(12) United States Patent
Kabuki et al.

(10) Patent No.: US 11,906,430 B2
(45) Date of Patent: Feb. 20, 2024

(54) LIGHT SOURCE DEVICE INCLUDING LASER-EXCITED LIGHT SOURCE

(71) Applicant: Ushio Denki Kabushiki Kaisha, Tokyo (JP)

(72) Inventors: Kiyoyuki Kabuki, Tokyo (JP); Yuichi Miura, Tokyo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 757 days.

(21) Appl. No.: 17/035,568

(22) Filed: Sep. 28, 2020

(65) Prior Publication Data
US 2021/0096078 A1 Apr. 1, 2021

(30) Foreign Application Priority Data
Sep. 30, 2019 (JP) .................................. 2019-178930

(51) Int. Cl.
*G02B 21/16* (2006.01)
*G01N 21/64* (2006.01)
*G02B 27/14* (2006.01)

(52) U.S. Cl.
CPC .......... *G01N 21/6458* (2013.01); *G02B 21/16* (2013.01); *G02B 27/141* (2013.01);
(Continued)

(58) Field of Classification Search
CPC ....... G01N 21/6458; G01N 2021/6419; G01N 2201/062; G02B 21/16; G02B 27/141;
(Continued)

(56) References Cited

U.S. PATENT DOCUMENTS 8,097,865 B2   1/2012 Westphal et al.
9,814,378 B2  11/2017 Moore
(Continued)

FOREIGN PATENT DOCUMENTS

CN   106054366 A   10/2016
JP   2013-202305 A  10/2013
WO  2018/045732 A1   3/2018

OTHER PUBLICATIONS

An Office Action; "Notice of Reasons for Refusal," mailed by the Japanese Patent Office dated Jan. 17, 2023, which corresponds to Japanese Patent Application No. 2019-178930 and is related to U.S. Appl. No. 17/035,568; with English language translation.
(Continued)

*Primary Examiner* — Arnel C Lavarias
(74) *Attorney, Agent, or Firm* — Studebaker & Brackett PC (57) ABSTRACT

A light source device includes at least one semiconductor laser and a laser-excited light source. The laser-excited light source has a phosphor excited by the semiconductor laser(s), and an optical system for extracting fluorescence emitted from the phosphor. The light source device also includes a plurality of LED light sources for emitting light having wavelengths different from a wavelength of the fluorescence. The light source device also includes a composite optical system for synthesizing the fluorescence from the laser-excited light source with the light from the LED light sources, and emitting the synthesized light from a light emitting portion. The LED light sources include an LED light source configured to emit light in an ultraviolet range. The LED light source configured to emit the light in the ultraviolet range is disposed at a position farther from the laser-excited light source than the remaining LED light source(s).

12 Claims, 5 Drawing Sheets

(52) U.S. Cl.
CPC ............ *G01N 2021/6419* (2013.01); *G01N 2201/062* (2013.01)

(58) Field of Classification Search
CPC .................. G02B 21/00; G02B 21/0004; G02B 21/0052; G02B 21/0076; G02B 21/06; F21L 2/00; F21L 14/00; F21V 9/06; F21V 9/20; F21V 9/30; F21V 9/32
USPC ....... 359/385, 362, 363, 368, 369, 388, 390; 362/84, 227, 228, 230, 231, 234, 249.01, 362/249.02, 249.06, 249.14, 362, 368, 362/373, 800
See application file for complete search history.

(56) References Cited

U.S. PATENT DOCUMENTS

| | | |
|---|---|---|
| 2008/0198448 A1 | 8/2008 | Ganser et al. |
| 2009/0201577 A1* | 8/2009 | LaPlante ............ G01N 21/6458 313/501 |
| 2010/0238412 A1* | 9/2010 | Kurosaki ............. H04N 9/3161 353/31 |
| 2013/0314893 A1 | 11/2013 | Paquette |
| 2014/0340869 A1 | 11/2014 | Wang et al. |
| 2016/0076735 A1 | 3/2016 | Wang et al. |
| 2016/0170218 A1 | 6/2016 | Johnson et al. |
| 2018/0067295 A1 | 3/2018 | Takaki et al. |
| 2018/0275416 A1 | 9/2018 | Wang et al. |
| 2019/0121146 A1 | 4/2019 | Wang et al. |
| 2021/0251478 A1* | 8/2021 | Mao ........................ A61B 1/04 |

OTHER PUBLICATIONS

The extended European search report issued by the European Patent Office dated Feb. 23, 2021, which corresponds to European Patent Application No. 20198601.5-1212 and is related to U.S. Appl. No. 17/035,568.

* cited by examiner

LIGHT SOURCE DEVICE INCLUDING LASER-EXCITED LIGHT SOURCE

TECHNICAL FIELD

The present invention relates to a light source device for use with a fluorescence microscope or the like and configured to combine light of a plurality of wavelengths and emit the combined light.

BACKGROUND ART

Conventionally, as a light source for a fluorescence microscope, used is an ultra-high-pressure mercury lamp having a plurality of bright lines, or a xenon lamp having continuous light.

In recent years, the light source technology for obtaining fluorescence has been put into practical use, which excites Ce-YAG phosphor by a semiconductor laser (laser diode or LD) to obtain fluorescence, in order to reduce environmental loads/burdens and the like. For example, U.S. Patent Application Publication No. 2019/0121146 discloses a light source device which is used as a light source for a microscope, and uses two dichroic mirrors (DM) to combine light from the phosphor, which is excited by the semiconductor laser, with the emitted light from two LEDs having different wavelengths including the ultraviolet range (UV range) in order to emit the combined light.

SUMMARY OF THE INVENTION

The light source device for fluorescence microscope often uses a high-power laser-excited light source to have a spectrum corresponding to many fluorescent reagents and obtain a clear fluorescence image. However, the laser-excited light source has disadvantages; the efficiency (ratio) of the light output to the electrical input is poor, and the laser-excited light source generates a large amount of heat. Therefore, the LED disposed near the laser-excited light source is susceptible to the heat of the laser-excited light source. In particular, if the light source device is small, an arrangement interval between the components becomes correspondingly small in the light source device, and the LED disposed near the laser-excited light source easily reaches a high temperature.

An LED has a characteristic that the higher the temperature, the lower the luminous efficiency. Thus, as the temperature of the LED rises, the light output of the LED drops. Especially in the LED that emits light in the UV range, this tendency is significant so that the LED tends to decrease the UV light output as the temperature rises.

Thus, if the light source device for a fluorescence microscope includes a laser-excited light source and a plurality of LEDs, the laser-excited light source becomes a heat source so that the LED for emitting light in the UV range is affected by the heat and the light output (amount of UV light emitted from the LED) drops.

An object of the present invention is to provide a light source device which includes a laser-excited light source and a plurality of LEDs for emitting light having different wavelengths including light in the UV range, and can stably generate light in the UV range.

According to one aspect of the present invention, there is provided a light source device that includes at least one semiconductor laser for excitation and a laser-excited light source. The laser-excited light source has a phosphor excited by the semiconductor laser(s), and an optical system (first optical system) for extracting fluorescence emitted from the phosphor. The light source device also includes a plurality of LED light sources for emitting light having wavelengths different from a wavelength of the fluorescence. The light source device also includes a composite optical system (second optical system) for synthesizing (combining) the fluorescence from the laser-excited light source with the light from the LED light sources, and emitting the synthesized light from a light emitting portion. The LED light sources include an LED light source configured to emit light in an ultraviolet range (band). Of the LED light sources, the LED light source configured to emit the light in the ultraviolet range is disposed at a position farther from the laser-excited light source than the remaining LED light source(s) configured to emit light of other wavelengths.

Since the LED light source for emitting the light in the UV range (UV-LED) is disposed at a position away from the laser-excited light source, which becomes a heat source as the laser-excited light source is operated, it is possible to suppress the temperature rise of the UV-LED and suppress a decrease in the output of the UV light.

The LED light sources may be arranged in a row along an optical axis of the first optical system. With this configuration, it is possible to arrange the LED light sources in a narrow width, and the light source device can be smaller or can be narrower.

The light emitting portion may be situated at an end of the optical axis of the first optical system, and the light source for emitting light in the ultraviolet range may be disposed at a position closest to the light emitting portion among the LED light sources. With this configuration, it is possible to cause the UV light emitted from the UV-LED to exit from the light emitting portion without losing or weakening the light emitted from the UV-LED. Thus, it is possible to appropriately obtain the radiation intensity of the UV light from the light source device.

Each of the LED light sources may emit light in a direction orthogonal to the optical axis of the first optical system. The composite optical system (second optical system) may include at least one dichroic mirror for converting a traveling direction of the light emitted from the LED light sources in a direction parallel to the optical axis of the first optical system, respectively.

With this configuration, it is possible to align the LED light sources and direct the LED light sources in the same (parallel) direction. Thus, it is possible to easily and appropriately arrange the LED light sources. Further, since the LED light sources are arranged so as to emit the light in a direction perpendicular to the optical axis of the first optical system, it is possible to easily convert the traveling direction of the light from each of the LED light sources in a direction parallel to the optical axis.

The second optical system may include a plurality of dichroic mirrors that correspond to the LED light sources respectively, and the dichroic mirrors may be disposed on the optical axis of the first optical system. With this configuration, it is possible to synthesize the light from the fluorescence with the light from the LED light sources on the optical axis of the first optical system. Further, since the dichroic mirrors are placed on the optical axis of the first optical system, it is possible to reduce the footprint of the light source device.

The LED light sources may be arranged in sequence along the optical axis of the first optical system from a vicinity of the laser-excited light source toward the light emitting portion such that the wavelengths of the light emitted from the respective LED light sources decrease in sequence. With this configuration, the design and fabrication of the dichroic mirrors are facilitated, and the dichroic mirrors can have inexpensive configurations.

Each of the LED light sources may include an LED, a collimating lens for collimating the light emitted from the LED concerned, and a first housing for housing the LED and the collimating lens, and the first housing may be made from metal.

With this configuration, it is possible to cause the heat generated in each LED to be conducted to the corresponding first housing. Since the first housing is a metal housing, it is possible to appropriately suppress the temperature rise of each of the LEDs, and suppress a decrease in light output of the light source device.

The light source device may further include a second housing for housing the laser-excited light source and the second optical system. The first housing may be disposed outside the second housing, and the second housing may be made from metal.

With this configuration, it is possible to cause the heat generated by the semiconductor laser(s) and the phosphor to be conducted to the second housing. Since the second housing is a metal housing, it is possible to appropriately suppress the temperature rise of the semiconductor laser(s) and the phosphor, and suppress a decrease in fluorescence output. Further, since the housing designed to accommodate the laser-excited light source is integral with the housing designed to accommodate the second optical system, it is possible to increase the surface area of the housing, and increase the heat-discharging efficiency of the heat generated from the laser-excited light source.

The LED light sources may have the first housings, respectively, and the first housings may be fixed on a same wall (same surface) of the second housing.

With this configuration, it is possible to improve the arrangement accuracy of the LED light sources, and reduce the optical loss (light output loss) of the light source device.

According to the light source device of the present invention, the UV-LED is arranged at a position farther from the laser-excited light source than the remaining LEDs. Therefore, it is possible to suppress the temperature rise of the UV-LED. As a result, it is possible for the light source device to stably output the light in the UV range.

DESCRIPTION OF EMBODIMENTS

Hereinafter, an embodiment of the present invention will be described with reference to the accompanying drawings.

Figure 1:
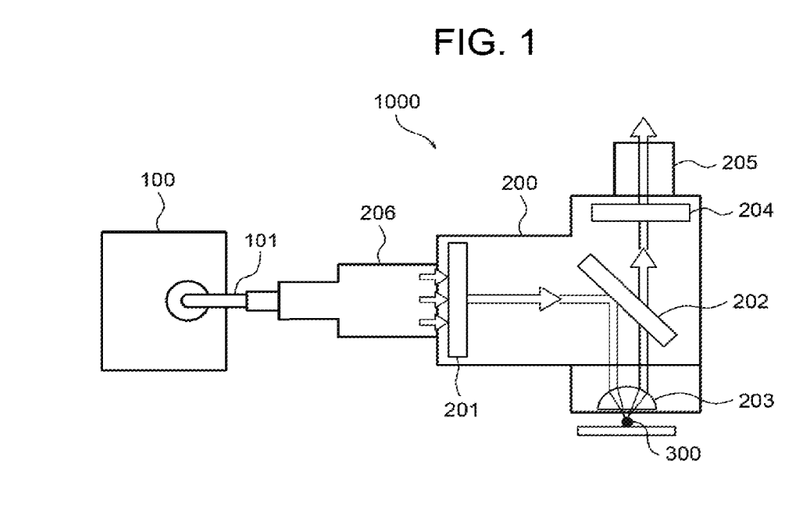
FIG. 1 shows a configuration of a fluorescent microscope that includes a light source device according to an embodiment of the present invention.

Referring to FIG. 1, shown is an exemplary configuration of a fluorescence microscope system 1000 that includes a light source device 100 of this embodiment.

A fluorescence microscope system 1000 includes the light source device 100, and a system main body (microscope main body) 200. The main body 200 includes an excitation filter 201, a dichroic mirror 202, an objective lens 203, an absorption filter 204, an eyepiece 205, and an optical adapter 206. The eyepiece 205 may also include an imaging optic (image-capturing unit), such as a camera. An optical fiber 101 extends to the system main body 200 from the light source device 100. Thus, the light from the light source device 100 is introduced to the microscope main body 200 through the optical fiber 101.

Among light emitted from the optical fiber 101 of the light source device 100, the optical adapter 206 allows only appropriate light to proceed to the main body 200. Then, the excitation filter 201 allows only the light having the excitation wavelength to proceed. The excitation light transmitted through the excitation filter 201 is reflected by the dichroic mirror 202 and is directed to a sample (fluorescent sample) 300 via the objective lens 203. The sample 300 is excited as the sample 300 is irradiated with excitation light, and emits fluorescence.

The fluorescence emitted from the sample 300 is incident on the dichroic mirror 202 via the objective lens 203, and enters the absorption filter 204 via the dichroic mirror 202. The absorption filter 204 cuts light of unnecessary wavelengths and allows only fluorescence generated from the sample 300 to enter the eyepiece 205. Thus, the fluorescence generated from the sample 300 can be observed.

Hereinafter, the details of the light source device 100 will be described.

Figure 2:
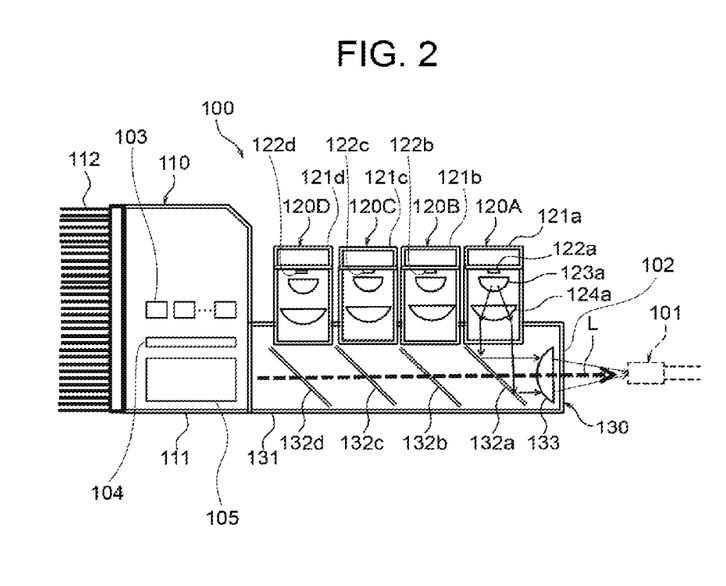
FIG. 2 shows a configuration of the light source device shown in FIG. 1.

FIG. 2 shows an exemplary configuration of the light source device 100. FIG. 2 is a view of the light source device 100 from above.

The light source device 100 includes a laser-excited light source 110, a plurality of LED light sources 120A to 120D, and a composite optical system 130.

The laser-excited light source 110 includes a semiconductor laser housing (referred to as "LD housing" or "laser diode housing") 111, and a cooling fin 112. The LD housing 111 is formed of a metal material having excellent heat dissipation. The LD housing 111 houses a plurality of excitation semiconductor lasers (LD) 103, a phosphor (fluorescent plate) 104 excited by excitation light from the excitation semiconductor lasers 103, and an optical system 105 for taking out the fluorescence emitted from the phosphor (yellow). The LD housing 111 may also house other components and parts. The cooling fin 112 is fixed to the LD housing 111 to release to the outside the heat which is generated by the semiconductor lasers 103 or phosphor 104 and conducted to the LD housing 111. The optical system 105 may be referred to as a first optical system.

The LED light source 120A includes a metallic LED housing 121a. The metallic LED housing 121a may be referred to as a first housing. The housing 121a accommodates a LED 122a, a collimating lens 123a and another collimating lens 124a. Light emitted from the LED 122a is collimated by the two collimating lenses 123a and 124a, and emitted from the collimating lens 124a as collimated light (parallel light). The LED housing 121a may be, for example, a metal housing having a cylindrical shape. The LED housing 121a may have a plurality of grooves so as to possess a cooling function.

The LED light sources 120B to 120D have the same configuration as the configuration of the LED light source 120A, and therefore description of the LED light sources 120B to 120D is omitted here.

The LED light sources 120A to 120D emit light of different wavelengths. In this embodiment, one of the LED light sources 120A to 120D emits light in the ultraviolet (UV) region or range.

In this embodiment, the LED light source 120A is an LED light source that emits light in the UV range. It should be noted that the UV-range light is light having a wavelength of 400 nm or less, which is defined by IEC 60050-845: 1987.

For example, the LED light source 120A includes the LED 122a having a peak wavelength of 365 nm. The LED light source 120B includes an LED 122b having a peak wavelength of 406 nm. The LED light source 120C has an LED 122c having a peak wavelength of 436 nm. The LED light source 120D has an LED 122d having a peak wavelength of 470 nm. Thus, the LED light sources 120D, 120C, 120B and 120A are arranged along (in parallel to) the optical axis L from a vicinity of the laser-excited light source 110 toward the light emitting portion 102 such that the wavelengths of the light emitted from the LED light sources 120D, 120C, 120B and 120A decrease in this order.

The composite optical system 130 synthesizes (combines) the light emitted from the LED light sources 120A to 120D with the fluorescence emitted from the laser-excited light source 110, and emits the synthesized light from a light emitting portion 102 of the light source device 100. It should be noted that the light emitting portion 102 may be referred to as a light emitting portion of the composite optical system 130. The optical system 130 may be referred to as a second optical system.

The composite optical system 130 includes a housing 131 for the optical system. The housing 131 is made from metal. The optical system housing 131 accommodates interference filters 132a to 132d and a condenser lens 133. The optical system housing 131 is connected to the LD housing 111, and the respective LED housings 121a to 121d of the LED light sources 120A to 120D are fixed on the same surface (same wall) of the optical system housing 131. In this embodiment, the LED housings 121a to 121d are fixed to a lateral wall of the optical system housing 131, and the LED light sources 120A to 120D emit light in the horizontal direction, respectively.

Incidentally, the optical system housing 131 may be integral with the LD housing 111. A combination of the optical system housing 131 and the LD housing 111 may be referred to as a second housing.

The interference filters 132a to 132d are formed of dielectric multilayer films. In this embodiment, the interference filters 132a to 132d are dichroic mirrors, and can reflect light in a specific wavelength range and transmit light in other wavelength ranges.

In this embodiment, the dichroic mirrors 132a to 132d are arranged on the optical axis L of the optical system 105 designed to extract the fluorescence of the laser-excited light source 110. Specifically, the LED light sources 120A to 120D are arranged such that the LED light sources emit light in a direction orthogonal to the optical axis L of the optical system 105 which extracts the fluorescence of the laser-excited light source 110. The dichroic mirrors 132a to 132d are disposed on the optical axis L at those positions which can receive light from the corresponding LED light sources 120A to 120D, respectively.

Figure 3:
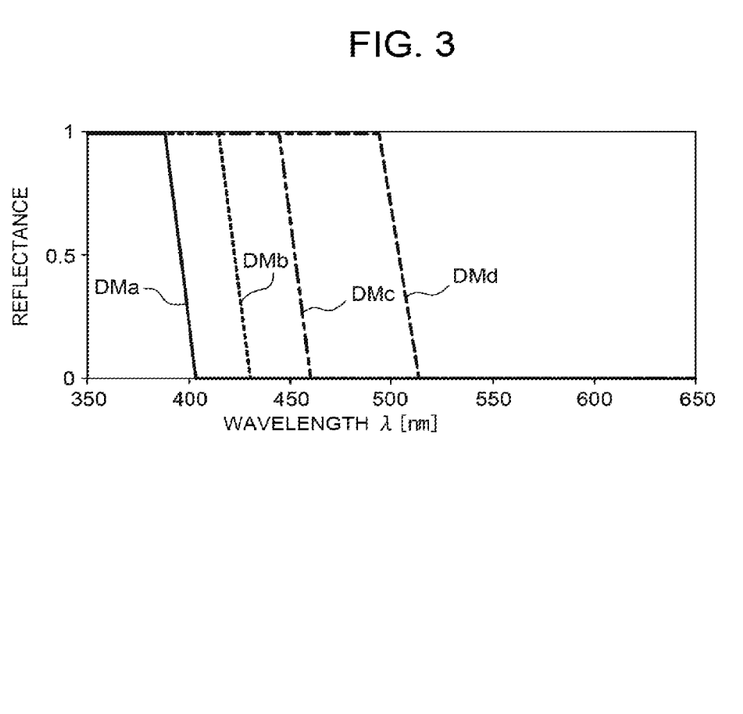
FIG. 3 shows a spectral reflectance of interference filters (dichroic mirrors).

FIG. 3 shows the spectral reflectance of each of the dichroic mirrors 132a to 132d. In FIG. 3, the solid line DMa indicates the characteristic of the dichroic mirror 132a, the dotted line DMb indicates the characteristic of the dichroic mirror 132b, the single-dot chain line DMc indicates the characteristic of the dichroic mirror 132c, and the dashed line DMd indicates the characteristic of the dichroic mirror 132d.

Because the dichroic mirrors 132a to 132d have the above-mentioned characteristics, the light having a wavelength of 365 nm emitted from the LED light source 120A is reflected by the dichroic mirror 132a and enters the condensing lens 133. Light having a wavelength of 406 nm emitted from the LED light source 120B is reflected by the dichroic mirror 132b, passes through the dichroic mirror 132a, and enters the condensing lens 133.

Light having a wavelength of 436 nm emitted from the LED light source 120C is reflected by the dichroic mirror 132c, passes through the dichroic mirrors 132b and 132a, and enters the condensing lens 133. Light having a wavelength of 470 nm emitted from the LED light source 120D is reflected by the dichroic mirror 132d, passes through the dichroic mirrors 132c, 132b, and 132a, and enters the condensing lens 133.

The yellow fluorescence emitted from the laser-excited light source 110 passes through the dichroic mirrors 132d, 132c, 132b, and 132a, and enters the condensing lens 133.

Thus, the fluorescence taken out from the laser-excited light source 110 travels straight and enters the condenser lens 133 as it is. On the other hand, the light emitted from the LED light sources 120A to 120D in a direction orthogonal to the optical axis L is caused to change the traveling direction thereof by the dichroic mirrors 132a to 132d respectively such that the light then travels in a direction parallel to the optical axis L, and enters the condensing lens 133.

In this manner, the fluorescence emitted from the laser-excited light source 110 and the light emitted from the LED light sources 120A to 120D are combined (synthesized) on the optical axis L and emitted to the outside from the condensing lens 133. The end of the optical system housing 131 located on the light emitting side of the condenser lens 133 becomes the light outlet 102 of the light source device 100.

When the optical fiber 101 is used, a cylindrical holder for the optical fiber may be disposed so that an end face of the optical fiber 101 is located at the focal plane of the condenser lens 133. This allows the light to enter the optical fiber 101 efficiently.

Figure 4:
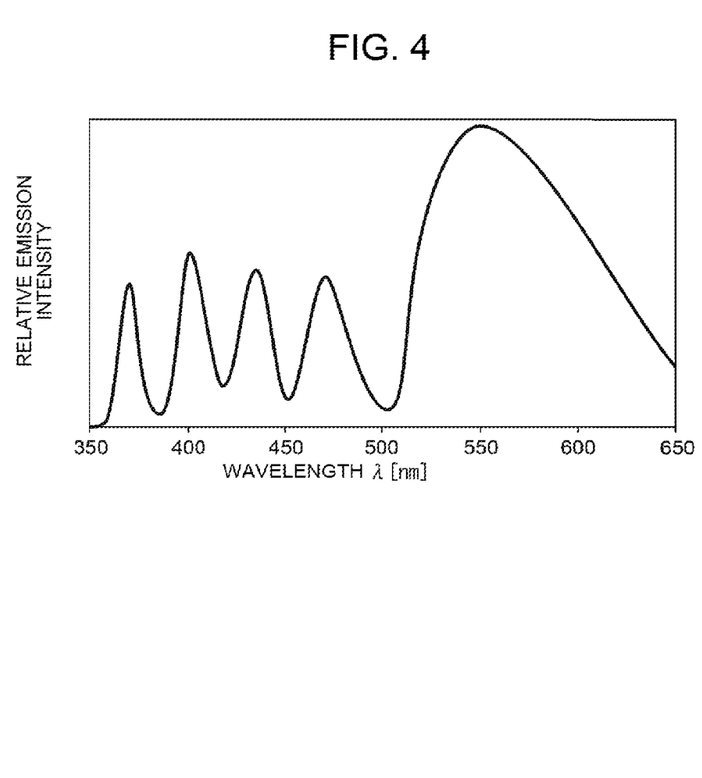
FIG. 4 shows the spectrum of light emitted by the light source device.

With the above-described configuration, the light source device 100 emits the light having the spectrum shown in FIG. 4.

Incidentally, the light output efficiency of the laser-excited light source is low, i.e., the light output to the electrical input is low or 15-25%. Thus, most of the electrical input that is not converted into light is converted into heat.

For example, if the light output efficiency η 1 of a semiconductor laser (LD) of a laser-excited light source is 35% (when the electrical input is 100W, the light output or the excited light is 35W and the heat is 65W), and the light emission efficiency η 2 of fluorescence is 50 to 60% (when the light output is 35W, the fluorescence output is 19W, and the heat is 16W), the light output efficiency η of the laser-excited light source is η 1×η 2=18 to 24%. That is, if the electrical input to the laser-excited light source is some 100W, an amount of generated heat can be as much as some 80W.

Thus, in the light source device for a fluorescence microscope, the semiconductor laser and phosphor disposed in the laser-excited light source become a heat source.

On the other hand, since the fluorescence microscope system used for biological observation or the like is installed in a laboratory or a particular facility, size reduction of the system is required to reduce the footprint. Therefore, even in the light source device for a fluorescence microscope, it is required to arrange the components close to each other. In such arrangement, the LED light source disposed in the vicinity of the laser-excited light source becomes easily very hot due to the influence of the exhaust heat from the laser-excited light source (or the heat generated in the laser-excited light source).

Figure 5:
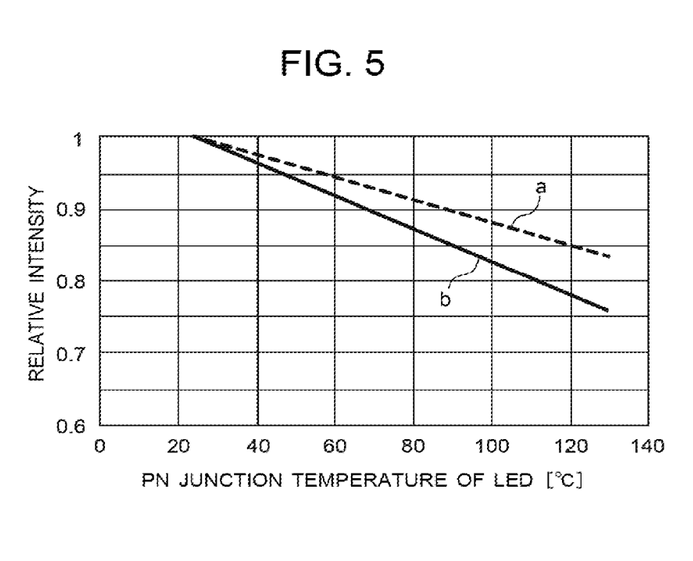
FIG. 5 shows the relation between LED temperature and the light output.

FIG. 5 shows the relationship between the temperature of the LED and the light output (light intensity). In FIG. 5, the horizontal axis indicates the temperature of the PN junction of the LED (junction temperature), and the vertical axis indicates the relative intensity when the light output at room temperature (25° C.) is taken as 1. The broken line a in FIG. 5 represents the relationship between the temperature and the light output of the LED that emits light having a wavelength of 406 nm. The solid line b in FIG. 5 represents the relationship between the temperature and the light output of the LED that emits light having a wavelength of 365 nm.

As shown in FIG. 5, the LED has the following thermal characteristics; the light emission efficiency drops as the junction temperature rises (i.e., the light output decreases as the junction temperature rises). The thermal characteristics vary depending on the type of the LED, and in particular, an LED (UV-LED) that emits light in the UV-range is susceptible to heat. As shown by the solid line b, the output of the UV-LED tends to drop more as compared with the LED that emits light having a wavelength of 406 nm indicated by the broken line a.

Therefore, in the light source device 100 for fluorescent microscope according to this embodiment, the LED light source 120A having the UV-LED 122a is disposed at a position farther away from the laser-excited light source 110, which is a heat source, than the remaining LED light sources 120B to 120D (i.e., the LED light sources having the other LEDs 122b to 122d).

As the UV-LED 122a is placed far from the laser-pumped light source 110, it is possible to suppress the temperature rise of the UV-LED 122a. Consequently, it is possible to suppress a decrease in the optical output (optical power) of the UV-LED 122a.

As shown in FIG. 2, the LED light sources 120A to 120D are arranged in a line (or in a row) along the optical axis L of the optical system 105 that extracts the fluorescence from the laser-excited light source 110. Among the LED light sources 120A to 120D, the LED light source 120A is disposed at a position farthest from the laser-excited light source 110, that is, at a position closest to the light emitting portion (light outlet) 102 of the light source device 100.

The LED light sources 120A to 120D are arranged to emit the light in the direction orthogonal to the optical axis L. The traveling direction of the light emitted from each of the LED light sources 120A to 120D is changed in a direction parallel to the optical axis L by the associated dichroic mirror 132a, 132b, 132c, 132d. The dichroic mirrors 132a to 132d are arranged on the optical axis L so that the fluorescence emitted from the laser-excited light source 110 and the light emitted from the LED light sources 120A to 120D and whose traveling direction is changed by the dichroic mirrors 132a to 132d are combined (synthesized) on the optical axis L.

Because the LED light sources 120A to 120D are arranged in a line along the optical axis L, it is possible to dispose the LED light sources 120A to 120D in a narrow-width region, and it is possible to make the light source device 100 compact (narrow-width). Furthermore, because the dichroic mirrors 132a to 132d are arranged on the optical axis L and the emitted light are synthesized on the optical axis L, the footprint of the light source device 100 can be further reduced.

Because the UV-LED 120A is disposed at a position closest to the light emitting portion 102 of the light source device 100, the light of the UV-LED 120A can exit from the light emitting portion 102 of the light source device 100 without losing (reducing, weakening) the light intensity of the UV-LED 120A. As a result, it is possible to obtain an appropriate output intensity of the UV-light.

In the arrangement shown in FIG. 2, the emitted light of the LED light source 120D arranged furthest from the light emitting portion 102 of the light source device 100 is transmitted through the four dichroic mirrors 132d, 132c, 132b and 132a and emitted to the optical fiber 101 from the light emitting portion 102 of the light source device 100. On the other hand, the emitted light of the UV-LED 122a (LED light source 120A) disposed at the position closest to the light emitting portion 102 of the light source device 100 is only reflected once by the dichroic mirror 132a and is emitted to the optical fiber 101 from the light emitting portion 102 of the light source device 100. Because the LED light source 120A is arranged at the position closest to the light emitting portion 102 of the light source device 100 in the illustrated embodiment, it is possible to eliminate the light loss in the UV light, which would otherwise be caused upon passing through the dichroic mirror(s), and to limit the light loss to the one-time reflection loss only.

The LED light sources 120A to 120D may be arranged linearly (in a row) in a predetermined order from the vicinity of the laser-excited light source 110 toward the light emitting portion 102 of the light source device 100 such that the wavelengths of the emitted light of the LED light sources 120A to 120D become shorter sequentially in the same order. In this arrangement, each of the dichroic mirrors 132a to 132d may have a filter characteristic that reflects light having a wavelength of emitted light from the corresponding LED light source 120A, 120B, 120C or 120D and transmits light having a wavelength longer than the wavelength of the emitted light, as shown in FIG. 3. Therefore, the design and fabrication of the filters (dichroic mirrors) is facilitated, and it is possible to make the dichroic mirrors 132a to 132d inexpensive.

Each of the LED light sources 120A to 120D can be directed and disposed to emit the light in the direction orthogonal to the optical axis L. Therefore, the LED light sources 120A to 120D can be easily and appropriately arranged.

Each of the LED light sources 120A to 120D has a configuration in which the LED 122a, 122b, 122c, 122d and the two collimator lens 123a/124a, 123b/124b, 123c/124c, 123d/124d are accommodated in the LED housing 121a, 121b, 121c, 121d made of metal. Each LED housing 121a, 121b, 121c, 121d, which accommodates the LED 122a, 122b, 122c, 122d and the collimating lenses 123a/124a, 123b/124b, 123c/124c, 123d/124d, is secured onto the same surface of the common housing 131 made of metal (in this embodiment, the optical system housing 131). Specifically, as show in FIG. 2, each LED housing 121a, 121b, 121c, 121d is fixed onto the lateral surface of the optical system housing 131.

Since the LED housings 121a, 121b, 121c and 121d are fixed onto the same surface of the common housing 131, it is possible to improve the arrangement (position and direction) accuracy of the LED housings 121a to 121d, and to improve the arrangement accuracy of the optical components. Therefore, it is possible to reduce the light loss of the emitted light from the LED light sources 120A to 120D.

Since each of the LEDs 122a to 122d of the LED light sources 120A to 120D is housed in the metal housing 121a, 121b, 121c, 121d (associated housing) together with the collimating lens, the heat generated by each of the LEDs 122a, 122b, 122c, 122d is conducted to its own metal housing (associated housing) 121a, 121b, 121c, 121d, and the temperature rise of each of the LEDs 122a, 122b, 122c, 122d can be suppressed.

Similarly, since the semiconductor lasers 103 and the phosphor 104 of the laser-excited light source 110 are housed in the metal housing 111 (associated housing) together with the optical system 105, the heat generated from the semiconductor lasers 103 and the phosphor 104 is conducted to their own metal housing (associated housing) 111, and it is possible to suppress the temperature rise of the semiconductor lasers 103 and the phosphor 104. Furthermore, since the optical system housing 131 is coupled to the LD housing 111, it is possible to increase the surface area of the metal housing that conducts the heat generated by the laser-excited light source 110. Thus, it is possible to improve the heat radiation efficiency (efficiency of discharging the heat).

Since the LED housings 121a to 121d are disposed outside the LD housing 111, it is possible to reduce an amount of heat, which is generated by the semiconductor lasers 103 and/or phosphor 104, to be transferred directly to the LEDs 122a to 122d, and suppress the temperature rise of the LEDs 122a to 122d.

As described above, the light source device 100 of this embodiment can be a small light source device including the laser-excited light source 110 and the LED light sources 120A to 120D that emit light having different wavelengths including the UV range, and can stably output light in the UV range.

Modifications

The present invention is not limited to the above-described embodiment. For example, the wavelengths (or the wavelength ranges) of the light emitted from the respective LED light sources 120A to 120D are not limited to those mentioned in the above-described embodiment. Also, the number of LED light sources (120A to 120D) provided in the light source device 100 is not limited to four. It is only necessary for the light source device 100 to have a plurality of LED light sources that emit light having wavelengths different from the fluorescence emitted from the laser-excited light source 110, with at least one of the LED light sources being configured to emit light in the ultraviolet range (UV range).

In the above-described embodiment, the LED light sources 120D, 120C, 120B and 120A are arranged in this order from the vicinity of the laser-excited light source 110 toward the light emitting portion 102 of the light source device 100, and the wavelengths of the light emitted from the LED light sources 120D to 120A decrease in the same order, but the arrangement of the LED light sources 120D to 120A is not limited to this order.

For example, the locations of the LED light sources 120B, 120C and 120D may be changed based on the thermal characteristics, rated input current, or the like while the laser-excited light source 110 is disposed at a position farthest from the light emitting portion 102 of the light source device 100, and the LED light source 120A is disposed at a position closest to the light emitting portion 102 of the light source device 100. When the locations (the arrangement order) of the LED light sources 120B to 120D are decided based on the thermal characteristics, the LED light source having the largest power reduction (light output reduction) due to heat is located farthest from the laser-excited light source 110, i.e., located next to the LED light source 120A, and the LED light source having the smallest power reduction due to heat is located closest to the laser-excited light source 110. Here, the power reduction (light output reduction) may be a reduction ratio. When the locations (the arrangement order) of the LED light sources 120B to 120D are decided based on the rated input current, the LED light source having the largest rated input current is disposed at a position closest to the laser-excited light source 110, and the LED light source having the smallest rated input current is disposed at a position farthest from the laser-excited light source 100, i.e., located next to the LED light source 120A.

As described in connection with the top view of the light source device 100 (FIG. 2), the LED light sources 120A to 120D emit the light in the horizontal direction, respectively, in the illustrated embodiment. It should be noted, however, that the direction of emitting the light from the LED light sources 120A to 120D is not limited to the horizontal direction as long as the direction of emitting the light is orthogonal to the optical axis L. For example, the LED light sources 120A-120D may emit the light from above or below the optical axis L.

Although the light source device 100 of the above-described embodiment is a light source device for use with the fluorescence microscope, the light source device 100 is applicable to an apparatus or device other than the fluorescence microscope. For example, the light source device 100 may be used as a light source device for semiconductor inspection (e.g., for light-resistant inspection of semiconductors) or as a light source device for material inspection.

This application is based on Japanese Patent Application No. 2019-178930 filed on Sep. 30, 2019, and the entire disclosure thereof is incorporated herein by reference.

What is claimed is:

1. A light source device comprising:
   at least one semiconductor laser for excitation;
   a laser-excited light source having a phosphor excited by the at least one semiconductor laser, and a first optical system for extracting fluorescence emitted from the phosphor;
   a plurality of light emitting diode (LED) light sources for emitting light having wavelengths different from a wavelength of the fluorescence; and
   a second optical system for synthesizing the fluorescence from the laser-excited light source with the light from the plurality of LED light sources, and emitting the synthesized light from a light emitting portion,
   the plurality of LED light sources including an LED light source configured to emit light in an ultraviolet range, and
   of the plurality of LED light sources, the LED light source configured to emit the light in the ultraviolet range being disposed at a position farther from the laser-excited light source than the remaining LED light source or LED light sources configured to emit light of other wavelengths.

2. The light source device according to claim 1, wherein the plurality of LED light sources are arranged in a row along an optical axis of the first optical system.

3. The light source device according to claim 2, wherein the light emitting portion is situated at an end of the optical axis of the first optical system, and the LED light source for emitting light in the ultraviolet range is disposed at a position closest to the light emitting portion among the plurality of LED light sources.

4. The light source device according to claim 2, wherein each of the plurality of LED light sources emits light in a direction orthogonal to the optical axis, and
the second optical system includes at least one dichroic mirror for converting a traveling direction of the light emitted from the plurality of LED light sources in a direction parallel to the optical axis of the first optical system, respectively.

5. The light source device according to claim 4, wherein said at least one dichroic mirror includes a plurality of dichroic mirrors that correspond to the plurality of LED light sources respectively, and the plurality of dichroic mirrors are disposed on the optical axis of the first optical system.

6. The light source device according to claim 2, wherein the plurality of LED light sources are arranged in sequence along the optical axis of the first optical system from a vicinity of the laser-excited light source toward the light emitting portion such that the wavelengths of the light emitted from the plurality of LED light sources decrease in sequence.

7. The light source device according to claim 1, wherein each of said LED light sources includes an LED, at least one collimating lens for collimating light emitted from the LED, and a first housing for housing the LED and said at least one collimating lens, and the first housing is made from metal.

8. The light source device according to claim 7 further comprising a second housing for housing the laser-excited light source and the second optical system, and wherein the first housing is disposed outside the second housing, and the second housing is made from metal.

9. The light source device according to claim 8, wherein the plurality of LED light sources have a plurality of said first housings, respectively, and the plurality of said first housing are fixed on a same wall of the second housing.

10. The light source device according to claim 2, wherein each of said LED light sources includes an LED, at least one collimating lens for collimating light emitted from the LED, and a first housing for housing the LED and said at least one collimating lens, and the first housing is made from metal.

11. The light source device according to claim 10 further comprising a second housing for housing the laser-excited light source and the second optical system, and wherein the first housing is disposed outside the second housing, and the second housing is made from metal.

12. The light source device according to claim 11 wherein the plurality of LED light sources have a plurality of said first housings, respectively, and the plurality of said first housing are fixed on a same wall of the second housing.

\* \* \* \* \*